United States Patent [19]

Nakagawa et al.

[11] Patent Number: 5,544,341
[45] Date of Patent: Aug. 6, 1996

[54] DATA ACCESS APPARATUS FOR PREVENTING FURTHER CACHE ACCESS IN CASE OF AN ERROR DURING BLOCK DATA TRANSFER

[75] Inventors: Hiromasa Nakagawa; Akira Yamada; Masayuki Hata, all of Itami, Japan

[73] Assignee: Mitsubishi Denki Kabushiki Kaisha, Japan

[21] Appl. No.: 454,893

[22] Filed: May 31, 1995

Related U.S. Application Data

[63] Continuation of Ser. No. 153,541, Nov. 15, 1993, abandoned, which is a continuation of Ser. No. 686,648, Apr. 17, 1991, abandoned.

[30] Foreign Application Priority Data

May 11, 1990 [JP] Japan ..................... 2-122463

[51] Int. Cl.⁶ .......................... G06F 13/00; G06F 11/00
[52] U.S. Cl. .................. 395/445; 395/479; 395/490; 395/182.03; 395/183.18; 364/DIG. 1; 364/243.41; 364/254.3; 364/265.3; 364/266.3; 364/944.92; 364/945.6; 364/957.1; 364/964.2; 371/40.1; 371/51.1
[58] Field of Search ...................... 395/479, 490, 395/456, 445, 182.03, 182.04, 183.18, 185.07; 371/10.1, 40.1, 40.2, 51.1, 21.1

[56] References Cited

U.S. PATENT DOCUMENTS

| | | | |
|---|---|---|---|
| 4,084,236 | 4/1978 | Chelberg et al. | 395/445 |
| 4,638,425 | 1/1987 | Hartung | 395/460 |
| 4,667,288 | 5/1987 | Keeley et al. | 395/183.01 |
| 4,740,889 | 4/1988 | Motersole et al. | 395/465 |
| 4,791,642 | 12/1988 | Taylor et al. | 371/40.2 |
| 4,831,581 | 5/1989 | Rubinfeld | 395/250 |
| 4,831,622 | 5/1989 | Porter et al. | 395/182.03 |
| 4,851,993 | 6/1989 | Chen et al. | 395/250 |
| 4,942,518 | 7/1990 | Weatherford et al. | 395/800 |
| 4,953,164 | 8/1990 | Asakura et al. | 371/40.1 |
| 4,959,835 | 9/1990 | Yosida et al. | 371/51.1 |
| 4,995,041 | 2/1991 | Hetherington et al. | 371/40.1 |
| 5,019,971 | 5/1991 | Lefsky et al. | 395/250 |
| 5,027,270 | 6/1991 | Riordan et al. | 395/467 |
| 5,119,485 | 6/1992 | Ledbetter, Jr. et al. | 395/473 |
| 5,185,879 | 2/1993 | Yamada et al. | 395/445 |

*Primary Examiner*—Glenn Gossage
*Attorney, Agent, or Firm*—Townsend and Townsend and Crew

[57] ABSTRACT

A data processor and method for preventing access to a cache memory when an abnormality occurs during a block data transfer. The data processor is provided with a central processing unit (CPU), a memory and the cache which stores a part of the data being stored in the memory. When the data to be accessed by the central processing unit is not stored in the cache, the data processor employs a block transfer method where the central processing unit reads out from the memory a block of data, including a predetermined number of data (words) in which the data to be accessed is located. When an abnormality, such as a parity error, is detected in transferring a data word in the block of data to be accessed, the cache is inhibited from reading another data word in the block to be accessed, and the CPU stops reading out the rest of the block of data to be read out from the memory, so that the central processing unit can immediately take action to respond to the abnormality.

1 Claim, 6 Drawing Sheets

Fig. 1

Prior Art

Fig. 2

Prior Art

DATA ACCESS APPARATUS FOR PREVENTING FURTHER CACHE ACCESS IN CASE OF AN ERROR DURING BLOCK DATA TRANSFER

This is a Continuation of application, Ser. No. 08/153,541, filed Nov. 15, 1993, now abandoned, which is a continuation of application Ser. No. 686,648, filed Apr. 17, 1991, now abandoned.

BACKGROUND OF THE INVENTION

1. Field of the Invention

The present invention relates to a data processor with a cache system and a data access method therefor, and in particular, to a data processor with a cache system which can execute high speed processing of a CPU after the occurrence of an abnormality in transferring data during reading of a plurality of data from a memory system to the cache when the cache misses, and to a data access method for a data processor.

2. Description of the Related Art

Figure 1:
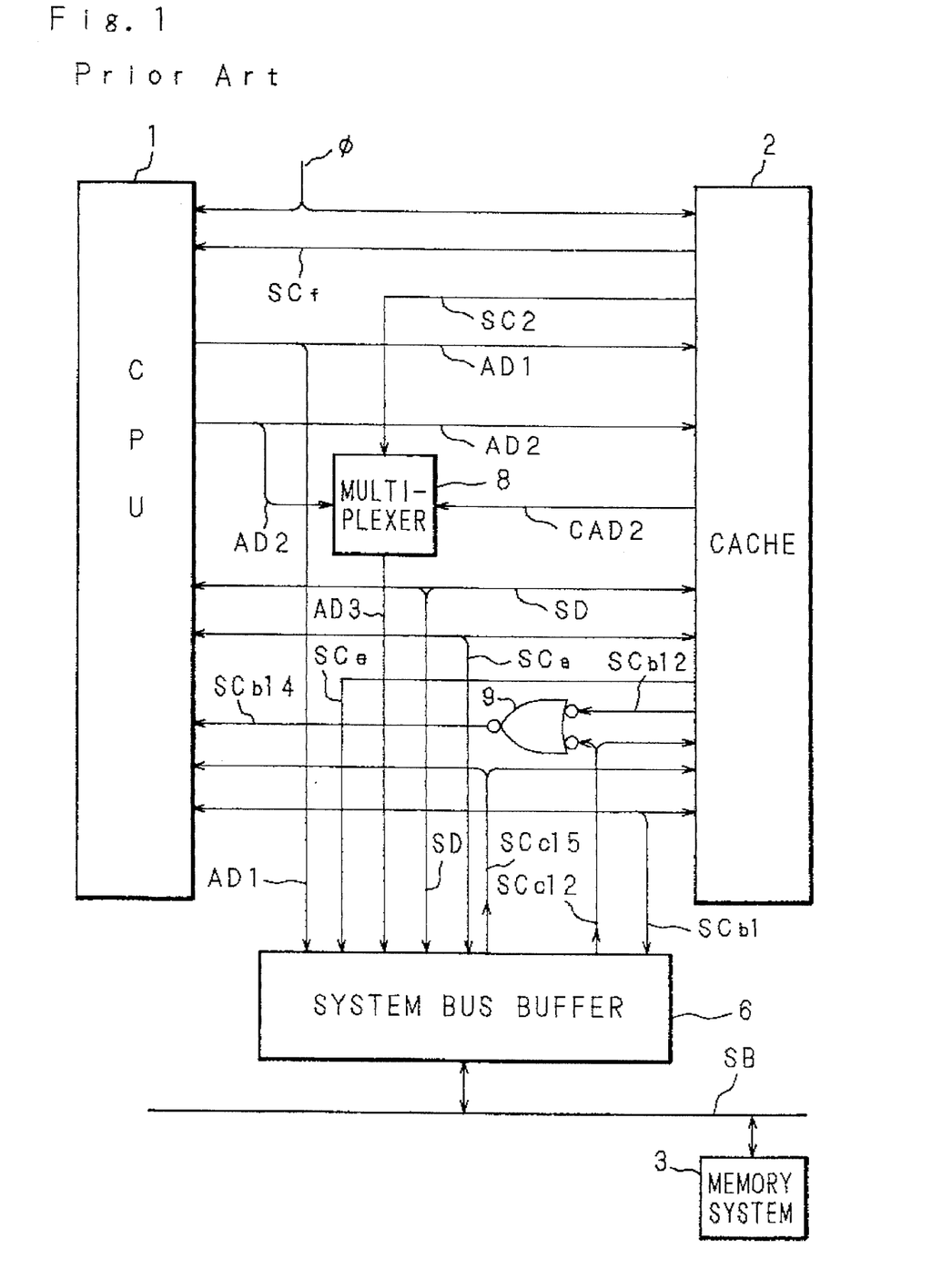
FIG. 1 is a block diagram showing configuration of a peripheral portion of a CPU and a cache of a conventional data processor.

FIG. 1 is a block diagram illustrating construction of a peripheral portion of the CPU and cache of the invention disclosed in Japanese Patent Application No. 2-10839 (1990) which is an example of a conventional data processor with a cache system.

In this prior art, there is shown a construction where a memory system 3 is only accessed by a block transfer mode which transfers multiple data from the memory system 3 in the case where a cache 2 misses after the CPU 1 accesses the cache 2 to read a specific item of data therefrom.

Reference numerals in FIG. 1 designate the following elements: 1, CPU; 2, cache; 3, memory system; 6, system bus buffer; 8, multiplexer; 9, OR logic circuit with inputs and output active low; and SB, system bus.

The system bus buffer 6 is provided as a common interface between the CPU 1 and cache 2 and the system bus SB.

Signals transmitted and received among the CPU 1 and cache 2 and the system bus buffer 6 are roughly divided into control signals, address signals and data signals.

A control signal SCa is used as a duplex common control signal among the CPU 1, the cache 2 and the system bus buffer 6; while, a control signal SCb1, which is used only in the case where the CPU 1 is a bus master, is used as a duplex signal between the CPU 1 and the cache 2 and as a duplex signal between the CPU 1 and the system bus buffer 6. Control signal SCb14, inputted to the CPU 1, is a signal outputted from the OR logic circuit 9 which receives both a ready signal SCb12 outputted from the cache 2 and a ready signal SCc12 outputted from the memory system 3 via the system bus buffer 6. SCb14 is used to indicate the end of data transfer to the CPU 1.

Incidentally, the ready signal SCb12 is used as a cache hit signal when the cache 2 hits.

A control signal SCc15 is an abnormal bus access signal which indicates that an abnormal bus access has occurred, such as an abnormality in which the read-access operation is unable to be performed when a read-access is executed to the memory system 3. The signal SCc15 is outputted from the system bus buffer 6 to the CPU 1 in the same way as the ready signal SCc12.

Signal SCe is an operation allowance signal outputted from the cache 2 to the memory system 3. Signal SCf is used to control the CPU 1 from the cache 2 in order to stop the CPU 1 from executing a new bus cycle so that the address signal or bus control signal can not be started.

An address signal AD1 is transmitted from the CPU 1 to both the cache 2 and the system bus buffer 6. An address signal AD2, which is used only when the CPU 1 is a bus master, is transmitted from the CPU 1 to both the cache 2 and a multiplexer 8. Address signal CAD2, which is used only when the cache 2 is the bus master, is transmitted from the cache 2 to the multiplexer 8.

In response to a multiplexer control signal SC2 outputted from the cache 2, the multiplexer 8 selects either the address signal AD2 or CAD2 to output as an address signal AD3 to the system bus buffer 6.

Incidentally, a data signal SD is used as a duplex common signal among the CPU 1, the cache 2 and the system bus buffer 6; and $\phi$ designates a clock signal which is transmitted to both the CPU 1 and the cache 2.

Operation will now be described for the case where the cache 2 hits and misses when the CPU 1 uses the cache 2 in a conventional cache systems constructed as described above, with reference to the timing charts of FIG. 2 and FIG. 3. In the following description, assuming that the CPU 1 attempts to read data for the cache 2, the control signal SCa is assumed to activate the cache 2.

Figure 2:
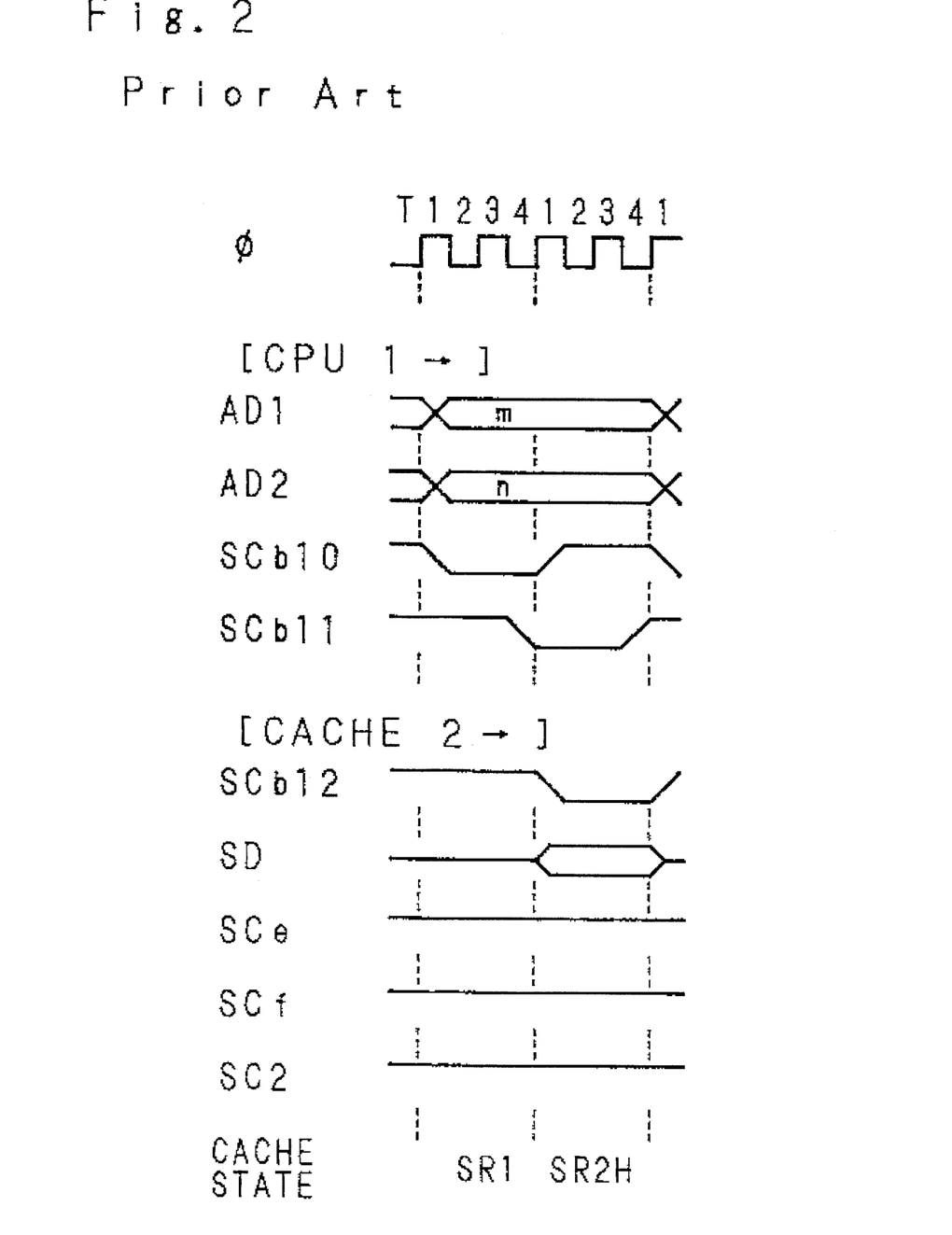
FIG. 2 is a timing chart showing operation procedures of the data processor of the invention as well as a conventional data processor shown in FIG. 1 when there is a cache hit to read specific data.

In the CPU 1, one bus cycle consists of four timings T1 through T4 (designated by T1234 in FIG. 2) of the clock $\phi$ as shown in FIG. 2. When the CPU 1 accesses to read a single data, this operation is completed in two bus cycles with no wait.

FIG. 2 is a timing chart illustrating the execution of a no wait operation in the case where the cache 2 hits when the CPU 1 attempts to read a single data from the cache 2.

In FIG. 2, [CPU 1 →] designates signals outputted from the CPU 1. The address signal AD1 (address value "m") designates the high order 28 bits of address output by the CPU 1. The address signal AD2 (address value "n") designates the low order 2 bits of the address.

Control signals SCb10, SCb11 are both included in the control signal SCb1. The former signal SCb10 is asserted over one bus cycle beginning at a rising edge of timing signal T1 (hereinafter referred to as T1 ↑) in order to indicate that the CPU 1 is starting a bus access for the external device. The latter signal SCb11 expects specific data and starts to be asserted after the rising edge of timing signal T4 during a bus cycle at which the control signal SCb10 is asserted.

In FIG. 2, [cache 2 →] designates signals outputted from the cache 2. When the cache 2 hits, the ready signal SCb12 (showing that the cache 2 hits), the data signal SD, the control signal SCe (which requests allowance of operation for the memory system 3), the control signal SCf (by which the cache 2 makes the CPU 1 stop initiation of new bus cycles), and the signal SC2 (which controls the multiplexer 8) are outputted.

In this case, because the cache 2 is not the bus master, the signal SC2 which controls is the multiplexer 8 and the control signal SCe which requests allowance of operation for the memory system 3 are both in the negated, or non-asserted, state.

Now will be described operation of a conventional data processor when the cache 2 hits in the case where the CPU 1 attempts to read from the cache 2, and FIG. 2 is a timing chart thereof.

The bus cycle in which the signal SCb10 is asserted by the CPU 1 and in which outputs of the next address signals AD1, AD2 are started is called state SR1 of cache 2. During the state SR1 of cache 2, it is determined whether the cache 2 hits or not. As a result of this determination, in the case where the cache 2 hits, during the next bus cycle, called state SR2H, the ready signal SCb12 (being the cache hit signal) is asserted. The ready signal SCb12, which is given through the OR logic circuit 9 to the CPU 1 as the ready signal SCb14, and the data signal SD are asserted so that data is transferred from the cache 2 to the CPU 1.

Next will be described below operation procedures of a conventional data processor in the case where four words of data including a single data word, are requested to be read-accessed by the CPU 1 and the cache 2 misses.

When the cache 2 is determined to have missed, the four words of data (including the single data which has been accessed by the CPU 1 for a read) are read from the memory system 3, connected to the system bus SB, by a round robin method.

Figure 3:
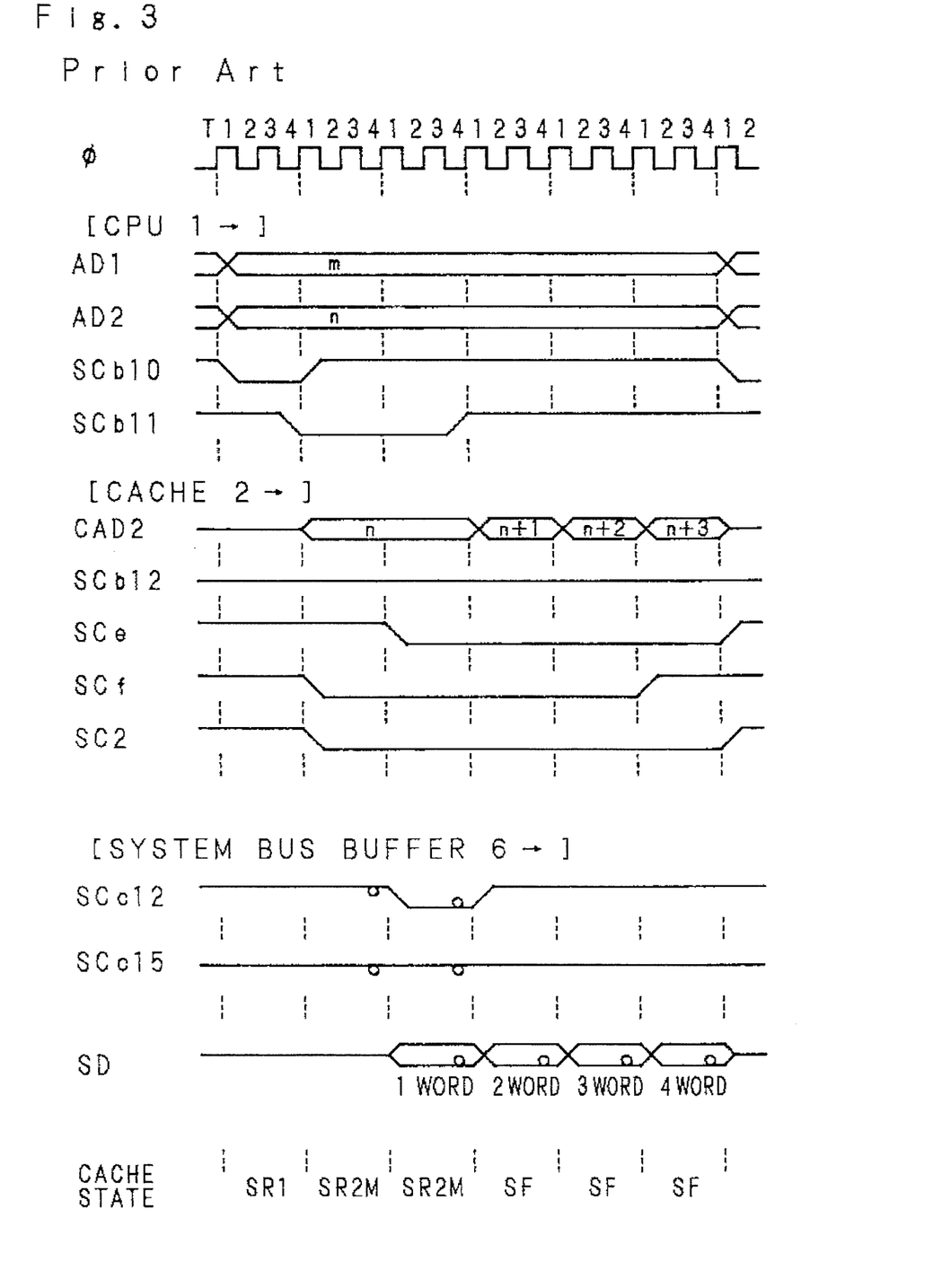
FIG. 3 is a timing chart showing operation procedures of data of the first word in block transferring at the time of normal accessing after cache misses to read a single data of the data processor of the invention as well as the conventional data processor shown in FIG. 1.

This operation is shown in the timing chart of FIG. 3 showing operation in the case where the cache misses. Incidentally, each of the control signals in FIG. 3 is low-active.

First, during the state SR1 in which read-access has been requested by the CPU 1, when the cache 2 is determined to have missed, the ready signal SCb12 (showing cache 2 hits) is not asserted after the next bus cycle (called state SR2M) but the control signal SCe for the system bus buffer 6 is asserted, and the read operation is activated for the memory system 3.

The cache 2 asserts the multiplexer control signal SC2 for the multiplexer 8, and outputs the address signal CAD2 (address value "n" accessed by CPU 1) from the cache 2 as the address signal AD3 to the system bus buffer 6. For this address, the ready signal SCc12, which has been transferred from the memory system 3, is inputted to the cache 2, while it is inputted as the ready signal SCb14 from the OR logic circuit 9 to the CPU 1.

At this time, in the present bus cycle (called state SR2M), the control signal SCf, which stops the CPU 1 from activating a new bus cycle, is asserted.

When both the ready signal SCc12 and data signal SD outputted from the system bus buffer 6 are asserted, the CPU 1 and cache 2 are simultaneously sampled at the timing T3 ↓ to read data. In addition, at this time, in the case where a read response from the memory system 3 delays, it is possible to delay the data-read of the CPU 1 and the cache 2 by delaying assertion of the ready signal SCc12. The CPU 1 negates (de-asserts) the control signal SCb11, terminating the read-access of the data to be accessed, that is, the single data to which read-access has been requested.

At this time point, the control signal SCf outputted from the cache 2 has already been asserted as described above. Then, the next bus cycle is not newly asserted and both the address signals AD1 and AD2 are holding their previous values "m" and "n" respectively. During that time, the CPU 1 can continue execution of its internal processing, such as pipeline processing.

After that, while the cache 2 sequentially increments the address signal CAD2 in the order of "n+1", "n+2", "n+3", respectively, by one bus cycle by the round robin method, it accesses the memory system 3 to read data of the second word, third word, and fourth word corresponding to each value.

Incidentally, while the cache 2 is outputting the value "n+3" as the address signal CAD2, it negates the control signal SCf so that the CPU 1 can execute a usual access from the next bus cycle, and negates the control signal SCe to stop the output of the address signal CAD2 after reading of data of the fourth word.

The operation of the invention of the above-mentioned Japanese Patent Application No. 2-10839 (1990) is described above.

Referring now to the timing chart of FIG. 4, an example of the case where the memory system 3 has a parity check function, for example, and when the cache 2 misses to read data of four words by the round robin method will be given. Also, explanation will be given on the operation in the case where the parity check result of data outputted from the memory system 3 indicates that there has been an error at the time of accessing the first word determined by the address signal AD1 ("m") (outputted from the CPU 1) and CAD2 ("n") (outputted from the cache 2).

Figure 4:
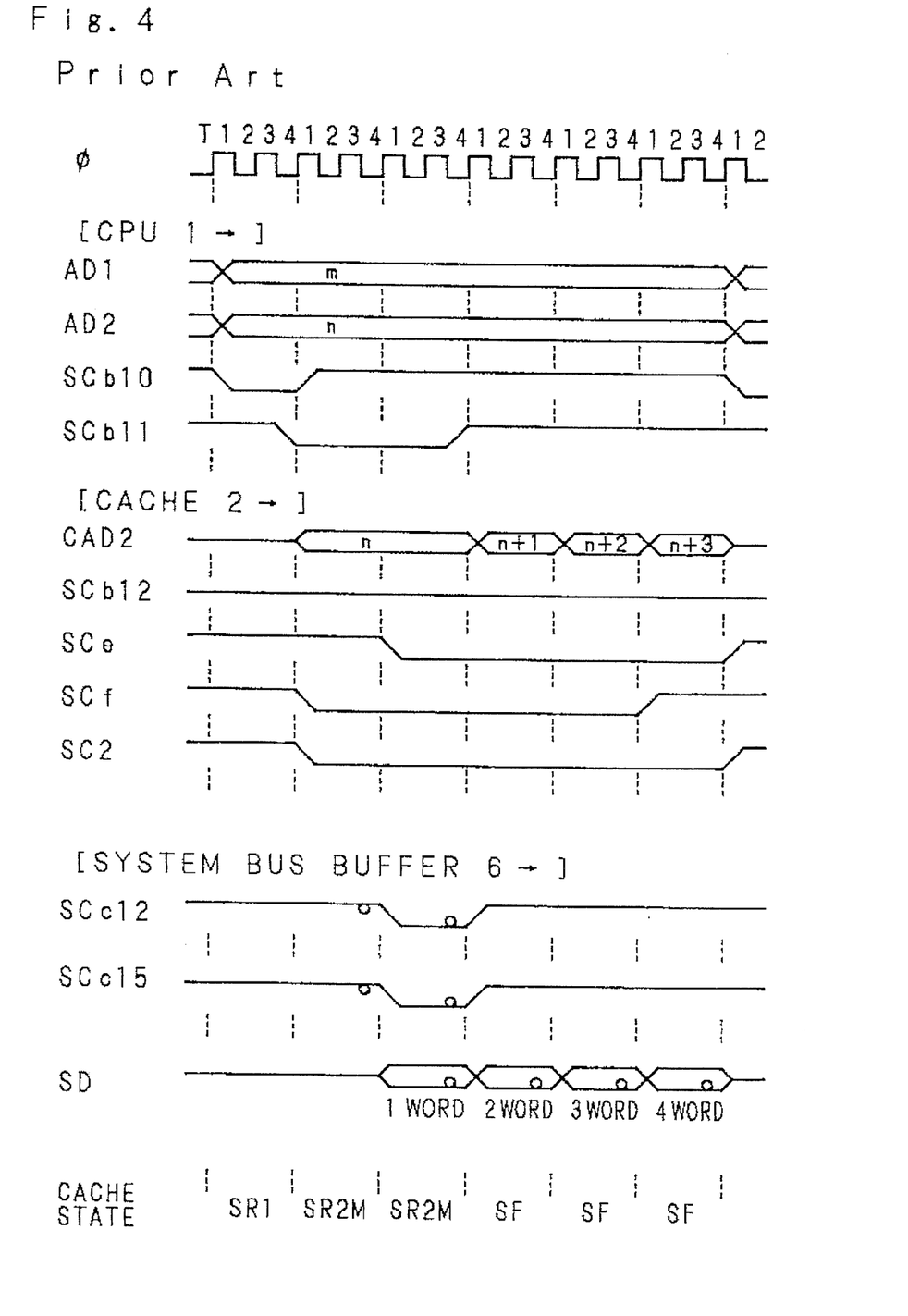
FIG. 4 is a timing chart showing operation procedures in the case where an abnormal bus access signal is asserted from the system bus buffer when reading the first word in a cache miss situation of the conventional data processor shown in FIG. 4.

As shown in the timing chart of FIG. 4, in the case where an error occurs, the data outputted from the memory system 3 is given to the CPU 1 and cache 2 with the abnormal bus access signal SCc15 and ready signal SCc12 outputted from the bus buffer 6 being asserted.

The data accessed by the CPU 1 according to the assertion of both of the signals SCc15 and SCc12 as aforementioned is read by the cache 2 at the same time. Predetermined processing must be executed for abnormal bus access at the time when the CPU 1 detects the abnormal bus access after the data is made ineffective.

On the other hand, the cache 2 determines that the data of the first word is an abnormal bus access, and the data of four words read by block transfer mode must be made ineffective without being stored in the cache 2. In the aforementioned conventional example, however, the cache 2 successively dummy-reads all of the requested data even when the abnormal bus cycle signal is inputted at the first word. Therefore the cache 2 sequentially increments and outputs the address signal CAD2 in the order of "n+1", "n+2", "n+3" by the round robin method. During this time, the CPU 1 cannot excuse abnormal bus access processing as the cache 2 is continuing to assert the control signal SCf thus stopping the initiation of new bus cycles.

Thus, as described above, we see the effect of an abnormal bus access response from the memory system 3 in a conventional data processor. In the case where the CPU 1 reads the first data when the CPU 1 accesses to read a single data for the cache 2 and the cache 2 misses, the CPU 1 cannot return to normal operation until the cache 2 finishes dummy-reading the remaining three words of the block transfer of every four words. In addition, there are various problems such as the case in which the cache 2 dummy-reads ineffective data of the remaining three words as the caches 2 is undergoing a block transfer, and thereby bus cycles are consumed uselessly.

SUMMARY OF THE INVENTION

The present invention has been designed in consideration of the circumstances, and the object thereof is to provide a microprocessor which can effectively use a bus cycle by stopping the reading-in of data to a cache and the reading-out of data from a memory to the CPU in the case where an abnormality occurs in transferring data at the time of a cache miss.

The data access method of the invention is the so-called block transferring method wherein the CPU reads out from memory a predetermined number, or block, of data in which data to be accessed is located at the head of the block. In the case where an abnormality occurs in transferring the data to be accessed, the cache does not read-in the data to be accessed and the CPU stops the reading-out of the remaining data to be read from memory.

In addition, the data processor of the present invention uses the so-called block transferring method wherein the CPU reads out from memory a predetermined number, or block, of data in which the specific data to be accessed is located at the head thereof. The data processor is provided with detecting means for detecting whether an abnormality has occurred in the transfer of data to be accessed, with means for preventing data to be accessed from memory by the cache from being read-in, and with means for stopping data-read from memory by the CPU.

According to the data access method and the data processor therefor, in the case where an abnormality occurs in transferring data to be accessed, the data to be accessed from memory by the cache is prevented from being read-in and the remaining data is also prevented by the CPU from being readout from memory. Thereby the CPU is enabled to immediately execute processing to cope with the abnormality which has occurred.

The above and further objects and features of the invention will more fully be apparent from the following detailed description with accompanying drawings.

DESCRIPTION OF THE PREFERRED EMBODIMENT

Now will be described below in detail a preferred embodiment of the present invention with reference to the accompanying drawings.

Figure 5:
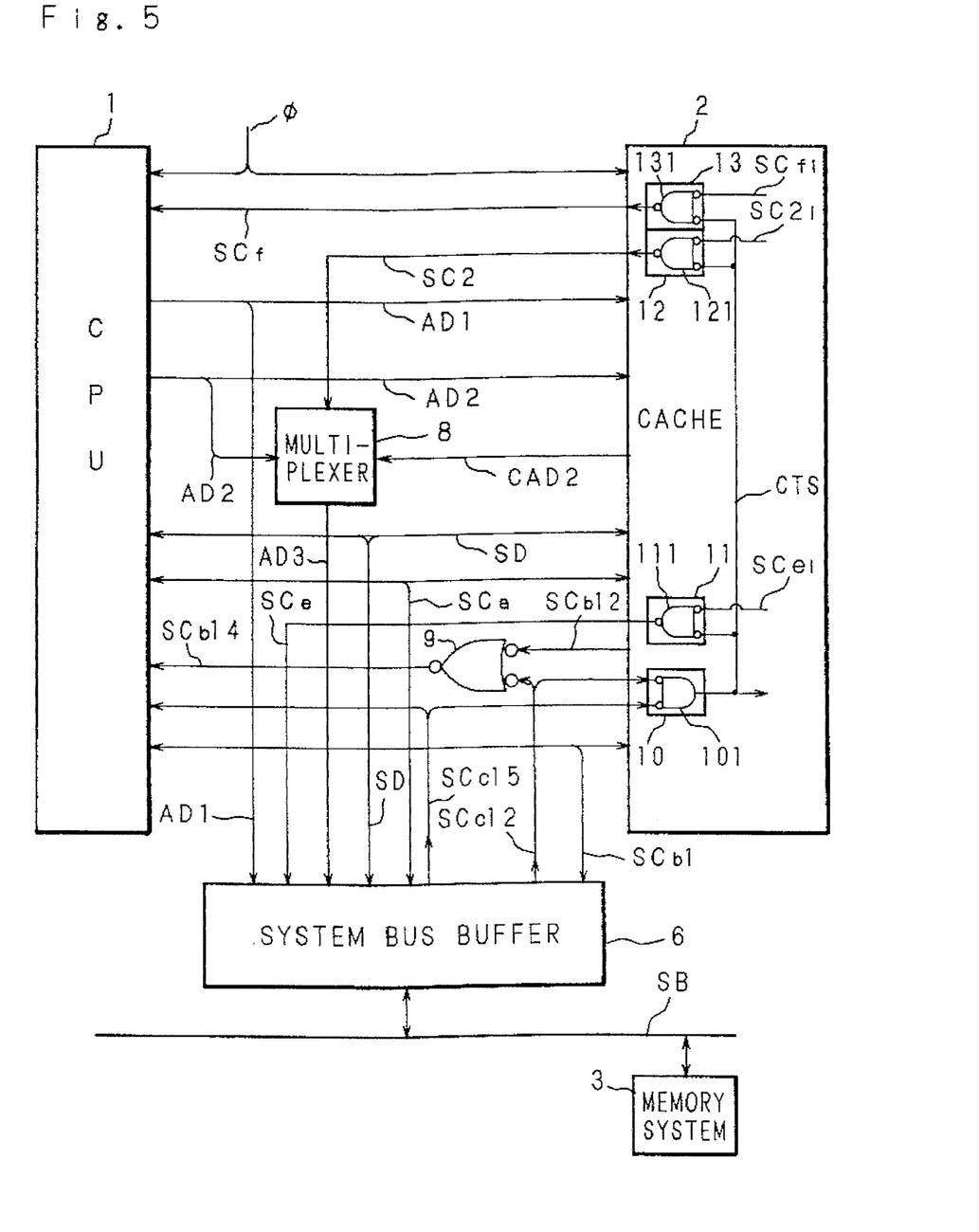
FIG. 5 is a block diagram showing configuration of peripheral portion of a CPU and a cache of the data processor of the present invention.

FIG. 5 is a block diagram to illustrate construction of a peripheral portion of a CPU 1 and a cache 2 in one example of a data processor of the present invention. Incidentally in this invention, when there is a cache 2 miss during access of a single data to be read from the CPU 1, memory system 3 is adapted to be accessed only by a block transfer mode which transfers plural data (or a block) from the memory system 3. Construction of the present invention shown in FIG. 5 is substantially similar to that of the prior art shown in FIG. 1, however, the data processor of the present invention has in the cache 2 a function which detects the condition of the ready signal SCc12 from the external memory system 3 and the abnormal bus access signal SCc15 during transfer of the of the first word of data under the block transfer mode. In this situation, the cache stops the block transfer after detecting the ready signal SCc12 and the abnormal bus access signal SCc15.

Reference numerals in FIG. 5 designate the following elements: 1, CPU; 2, cache; 3, memory system; 6, system bus buffer; 8, multiplexer; 9, OR logic circuit with inputs and output active low; and SB, system bus.

The system bus buffer 6 is provided as a common interface between the CPU 1 and cache 2 and the system bus SB.

Signals transmitted and received among the CPU 1 and the cache 2 and the system bus buffer 6 are roughly divided into control signals, address signals and data signals.

A control signal SCa is used as a duplex common control signal among the CPU 1, the cache 2 and the system bus buffer 6; while a control signal SCb1, which is used only in the case where the CPU 1 is a bus master, is used as a duplex signal between the CPU 1 and the cache 2 and as a duplex signal between the CPU 1 and the system bus buffer 6. A control signal SCb14 to be inputted to the CPU 1 is an OR signal outputted from the OR logic circuit 9 which receives both a ready signal SCb12 outputted from the cache 2 and a ready signal SCc12 outputted from the memory system 3 via the system bus buffer 6, used to transmit an indication of the end of data transfer to the CPU 1.

Incidentally, the ready signal SCb12 is used as a cache hit signal when the cache 2 hits.

A control signal SCc15 is an abnormal bus access signal which indicates a bus access abnormality has occurred, such as an abnormality in which the read-access operation is unsuitable when a read-access is executed to the memory system 3. The signal is outputted in addition to the ready signal SCc12 to the CPU 1 or cache 2. This signal is used to indicate that the read-access is improper, for example.

A signal SCei (SCe) is an operation allowance signal outputted from the cache 2 to the memory system 3. A signal SCfi (SCf) is used to control the CPU 1 from the cache 2 to prevent the CPU 1 from executing a new bus cycle so that the address signal or bus control signal can not be started.

An address signal AD1 is transmitted from the CPU 1 to both the cache 2 and the system bus buffer 6. An address signal AD2 which is used only when the CPU 1 is a bus master is transmitted from the CPU 1 to both the cache 2 and a multiplexer 8. An address signal CAD2 which is used only when the cache 2 is the bus master is transmitted from the cache 2 to the multiplexer 8.

In response to a multiplexer control signal SC2i (SC2) outputted from the cache 2, the multiplexer 8 selects either the address signal AD2 or CAD2 to output as an address signal AD3 to the system bus buffer 6.

Incidentally, a data signal SD is used as a duplex common signal among the CPU 1, the cache 2 and the system bus buffer 6; and φ designates a clock which is transmitted to both the CPU 1 and the cache 2.

In the data processor of the present invention, a function is provided in cache 2, which stops completion of the block transfer mode by detecting the state of the ready signal SCc12 from the external memory system and the abnormal bus access signal SCc15 during transfer of the first data of the block transfer mode (that is, the data to be accessed by the CPU 1). A more detailed explanation will be made in the following paragraphs.

In the cache 2 of the data processor of the invention, an abnormal bus access detecting circuit 10, an SCe control circuit 11, an SC2 control circuit 12 and an SCf control circuit 13 are provided. The abnormal bus access detecting circuit 10 receives as inputs the ready signal SCc12 and an abnormal bus access signal SCc15. In the case where both signals are asserted, the abnormal bus access detecting circuit 10 detects the state of abnormal bus access, then outputs a bus access stop signal CTS to be given to the above-mentioned Sce control circuit 11, SC2 control circuit 12 and SCf control circuit 13.

The abnormal bus access detecting circuit 10 comprises, to be concrete, a NOR logic circuit 101 with two inputs. For example, the ready signal SCc12 and abnormal bus access signal SCc15 are given to the inputs. In the case where both the input signals (the ready signal SCc12 and the abnormal bus access signal SCc15) are in the asserted state, that is, both signals are low level, the detecting circuit 10 asserts the high active output signal, that is, the bus access stop signal CTS is asserted to high level.

In the case where the bus access stop signal CTS is inputted to the SCe control circuit 11, SC2 control circuit 12 and SCf control circuit 13 from the abnormal bus access detecting circuit 10, the control circuits negate the respective output signals SCe, SC2 and SCf to high level.

Each of the control circuits 11, 12 and 13 comprises, to be concrete, AND logic circuits 111, 121 and 131 respectively, each circuit having two inputs. To one input of each of the logic circuits 111, 121 and 131, the bus access stop signal CTS is given, and to other input of each logic circuit, signals SCei, SC2i and SCfi are given, respectively. Accordingly, in the case where the bus access stop signal CTS is negated, the control circuits 11, 12 and 13 output the respective input signals SCei, SC2i and SCfi as the respective output signals SCe, SC2 and SCf intact. However, in the case where the bus access stop signal CTS is asserted, the control circuits 11, 12 and 13 forcefully negate the respective output signals SCe, SC2 and SCf.

Now will be described below operation of the cases where the cache 2 hits, and when the cache 2 misses when the CPU 1 uses the cache 2 in such a cache system of the present invention as constructed above, with reference to the timing charts of FIG. 2 and FIG. 3. In the following description, assuming that the CPU 1 accesses to read data for the cache 2, the control signal SCa is assumed to activate the cache 2. The bus access stop signal CTS being the output signal of the abnormal bus access detecting circuit 10 also is not asserted.

In the CPU 1, one bus cycle consists of four timings T1 through T4 (designated by T1234 in FIG. 2) of the clock φ as shown in FIG. 2, and when the CPU 1 accesses to read a single data, this operation is completed in two bus cycles with no wait.

FIG. 2 is a timing chart to illustrate the state of execution of no wait operation in the case where the cache 2 hits when the CPU 1 accesses to read the single data for the cache 2.

In FIG. 2, [CPU 1 →] designates signals outputted from the CPU 1. The address signal AD1 (address value "m") designates the high order 28 bits of address. The address signal AD2 (address value "n") designates the low order 2 bits of address.

Both control signals SCb10 and SCb11 are included in the control signal SCb1. The former signal SCb10 is asserted over one bus cycle from a rise of timing T1 (hereinafter referred to as T1 ↑) in order to indicate that the CPU 1 is starting a bus access for the external device. The latter signal SCb11 expects defined data and starts to be asserted at a rise of timing T4 at which the control signal SCb10 is asserted.

In FIG. 2, [cache 2 →] designates signals outputted from the cache 2. When the cache 2 hits, the ready signal SCb12 (showing that the cache 2 hits), the data signal SD, the control signal SCe (which requests allowance of the operation for the memory system 3), the control signal SCf (by which the cache 2 makes the CPU 1 stop initiation of new bus cycles and the signal SC2 (which controls the multiplexer 8) are outputted.

In this case, because the cache 2 is not the bus master, the signal SC2 which controls the multiplexer 8 and the control signal SCe which requests allowance of the operation for the memory system 3 are both in the negated state.

Now will be described below operation of the data processor of the present invention when the cache 2 hits in the case where the CPU 1 accesses to read from the cache 2, and FIG. 2 is a timing chart thereof.

The bus cycle in which the signal SCb10 is asserted by the CPU 1 and in which outputs of the next address signals AD1, AD2 are started is called a state SR1 of cache 2. During the state SR1 of cache 2, it is decided whether the cache 2 hits or not. As a result of this decision, in the case where the cache 2 hits, during the next bus cycle called state SR2H, the ready signal SCb12 (being the cache hit signal) is asserted. The ready signal SCb12, which is given through the OR logic circuit 9 to the CPU 1 as the ready signal SCb14, and the data signal SD is asserted so that data is transferred from the cache 2 to the CPU 1.

The operation when the cache 2 hits aforementioned is the same as the one of the above-stated conventional example.

Now, operation procedures of the data processor of the present invention will be described in the case where the CPU 1 attempts to read-access data of 4 words including a specific item of data and when the cache 2 misses.

When the cache 2 is determined to have missed, the data of 4 words (including the single data which has been accessed to be read by the CPU 1) are read from the memory system 3 being connected to the system bus SB by the round robin method.

This operation is shown in the timing chart of FIG. 3 showing the operation procedures in the case where the cache misses. Incidentally, each of the control signals in FIG. 3 is low-active. In addition, in the timing chart of FIG. 3, the bus access stop signal CTS being the output signal of the abnormal bus access detecting circuit 10 is not asserted.

First, during the state SR1 in which read-access has been requested by the CPU 1, when the cache 2 is determined to have missed, the ready signal SCb12 (showing cache 2 hits) is not asserted after the next bus cycle (called state SR2M) but the control signal SCe for the system bus buffer 6 is asserted, and the read operation is activated for the memory system 3.

The cache 2 asserts the multiplexer control signal SC2 for the multiplexer 8, and outputs the address signal CAD2 (address value "n" accessed by CPU 1) outputted from the cache 2 as the address signal AD2 to the system bus buffer 6. For this address, the ready signal SCc12, which has been transferred from the memory system 3, is inputted to the cache 2, while it is inputted as the ready signal SCb14 from the OR logic circuit 9 to the CPU 1.

At this time, in the present bus cycle (called state SR2M) the control signal Scf, which prevents the CPU 1 from activating a new bus cycle, is asserted.

When the ready signal SCc12 and data signal SD outputted from the system bus buffer 6 are both asserted, the CPU 1 and cache 2 are simultaneously sampled at the timing T3 ↓ to read data. In addition, at the time, in the case where a read response from the memory system 3 is delayed, it is possible to delay the data-read of the CPU 1 and the cache 2 by delaying assertion of the ready signal SCc12. The CPU 1 negates the control signal SCb11, terminating the read-access of the data to be accessed, that is, the single data to which read-access is requested.

At this point of time, the control signal SCf outputted from the cache 2 has already been asserted as described above. Then, the next bus cycle is not newly asserted and both the address signals AD1, AD2 are holding their previous values "m" and "n". During that time, the CPU 1 can continue execution of its internal processing, such as pipeline processing.

After that, while the cache 2 sequentially increments the address signal CAD2 by the values "n+1", "n+2", "n+3" respectively by one bus cycle by the round robin method, it accesses the memory system 3 to read data of the second word, third word, and fourth word corresponding to each value.

Incidentally, while the cache 2 is outputting the value "n+3" as the address signal CAD2, it negates the control signal SCf so that the CPU 1 can execute a usual access from the next bus cycle, and negates the control signal SCe to stop the output of the address signal CAD2 after reading data of the fourth word.

Also, the operation in the case where the data of the first word when the cache misses to read is accessed normally is the same as the aforementioned conventional example.

Figure 6:
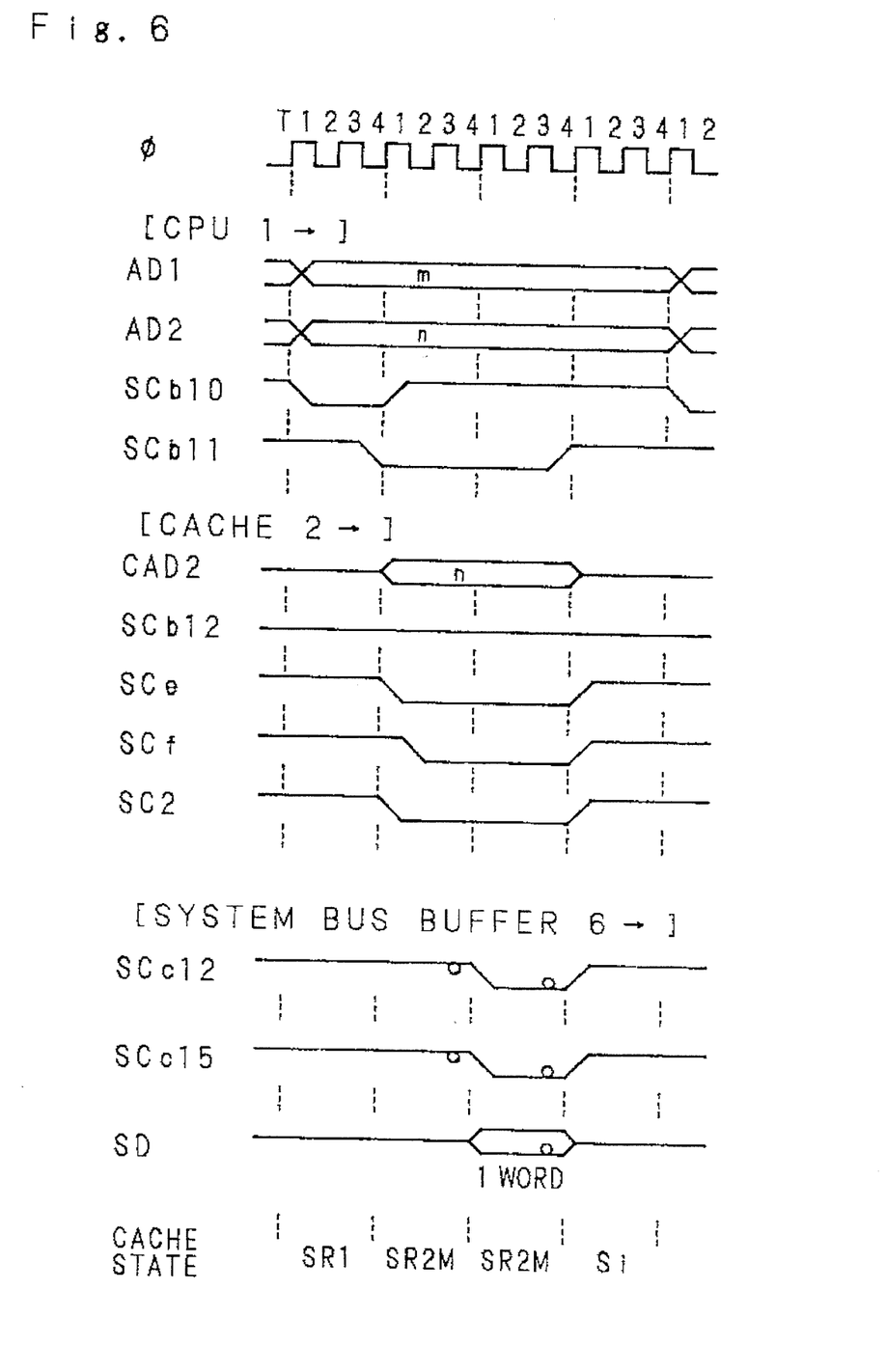
FIG. 6 is a timing chart showing operation procedures in the case where abnormal bus access occurs in transferring data of the first word when a cache miss occurs.

Here, explanation will be given of the operation in the case where the memory system 3 of the data processor of the present invention has a parity check function, for example, and in the case where the cache 2 misses to read data of four words from the memory system 3 by the round robin method, and in the case where there is an error in the parity check result of the data outputted from the memory system 3 in accessing data of the first word, that is, the data to be accessed by the CPU 1, determined by the address signal AD1 ("m") (outputted from the CPU 1) and the address signal CAD2 ("n") (outputted from the cache 2).

In the case where it is judged that an error occurs in the parity check, as shown in the timing chart in FIG. 6, the memory system 3 asserts the abnormal bus access signal SCc15 and ready signal SCc12 outputted from the system bus buffer 6 and gives it to the cache 2. According to the assertion of both of the signals, the cache 2 also reads the data accessed by the CPU 1, however, predetermined processings for the abnormal bus access must be executed after the data is made ineffective at the time when the CPU 1 detects the abnormal bus access.

On the other hand, the cache 2 judges the data of the first word to be an abnormal bus access, and is required to make the data of four words (to be read by block transfer mode) ineffective without storing it.

At this time, as both of the ready signal SCc12 and abnormal bus access signal SCc15 (both being the respective inputs of the abnormal bus access detecting circuit 10) are asserted to become low level, the abnormal bus access detecting circuit 10 asserts the bus access stop signal CTS at high level. By the assertion of the bus access stop signal CTS, the SCe control circuit 11, SC2 control circuit 12 and SCf control circuit 13 negate the respective output signals SCe, SC2 and SCf. According to the above, as the cache 2 stops the block transfer of data in a state Si and the CPU 1 stops bus cycles for transferring data of the second through fourth words thereafter, the CPU 1 is enabled to immediately execute abnormal bus access processing, for example, as the next bus access other than data transferring.

The above embodiment is so constructed that the block transfer of the data is to be stopped in the case where a parity error is detected. However, it is possible to construct a data processor so as to operate in the same way in detecting other various errors.

As described in the above, according to the data processor of the present invention, the cache accesses only by a block transfer mode which transfers a plurality of data (including the data to be accessed) to the memory system in the case where the cache misses for the read access of a single data from the CPU 1, and the cache stops data transferring on and after the second word in a case where an abnormal bus access request occurs during data transferring of the first word from the memory system to the cache. It is thus possible to reduce useless bus cycles and the CPU can immediately execute procedures to deal with an abnormal bus access.

As this invention may be embodied in several forms without departing from the spirit of essential characteristics thereof, the present embodiment is therefore illustrative and not restrictive, since the scope of the invention is defined by the appended claims rather than .by the description preceding them, and all changes that fall within the metes and bounds of the claims, or equivalence of such metes and bounds thereof are therefore intended to be embraced by the claims.

What is claimed is:

1. A data access apparatus in a data processor, said data processor being provided with a CPU, a memory for storing data to be accessed by said CPU, a cache for storing a part of the data being stored in memory and a system bus buffer, comprising a first circuit in said cache which receives first a second signals and outputs a third signal, said first signal being a ready signal output by said memory, said second signal being a signal indicating a bus access abnormality has occurred during transfer of data to said cache, following a cache miss, and said third signal being a bus access stop signal which is asserted when said second signal is asserted;

a second circuit in said cache for receiving said third signal and a fourth signal and outputting a fifth signal, said fourth signal being a control signal for the system bus buffer request allowance of operation of the memory, said fifth signal inhibiting a block transfer of data from said memory to said cache when said third signal is asserted; and a third circuit in said cache for receiving said third signal and a sixth signal and outputting a seventh signal, said sixth signal being a control signal for said CPU and said seventh signal preventing said CPU from executing a new bus cycle when said third signal is asserted.

* * * * *